United States Patent [19]

Grisik

[11] 4,004,047
[45] Jan. 18, 1977

[54] DIFFUSION COATING METHOD
[75] Inventor: John J. Grisik, Middletown, Ohio
[73] Assignee: General Electric Company, Cincinnati, Ohio
[22] Filed: Sept. 2, 1975
[21] Appl. No.: 609,829

Related U.S. Application Data
[62] Division of Ser. No. 447,318, March 1, 1974.
[52] U.S. Cl. .............................. 427/142; 29/197; 29/197.5; 29/401 R; 29/402; 427/252; 427/253; 427/320
[51] Int. Cl.² .......................................... B23P 7/04
[58] Field of Search .......... 427/140, 142, 248, 250, 427/252, 253, 320, 328, 287; 29/197, 197.5, 198, 423, 420, 401 E, 402

[56] References Cited
UNITED STATES PATENTS

| | | | |
|---|---|---|---|
| 3,149,996 | 9/1964 | Wagner et al. | 428/483 |
| 3,415,676 | 12/1968 | Nishi et al. | 427/192 |
| 3,513,013 | 5/1970 | Willis et al. | 228/58 X |
| 3,589,935 | 6/1971 | Brill-Edwards et al. | 427/250 |
| 3,598,638 | 8/1971 | Levine | 427/203 |
| 3,647,497 | 3/1972 | Levine et al. | 427/209 |
| 3,667,985 | 6/1972 | Levine et al. | 427/190 |
| 3,837,901 | 9/1974 | Seybolt | 106/1 X |
| 3,847,649 | 11/1974 | Sova | 427/428 |

Primary Examiner—Ralph S. Kendall
Assistant Examiner—Bruce H. Hess
Attorney, Agent, or Firm—Lee H. Sachs; Derek P. Lawrence

[57] ABSTRACT

Complete coating or localized repair and replacement of a diffusion aluminide coating applied to the surface of an article is attained through use of a powdered Fe-Al alloy as a source of aluminum. In another aspect, more accurate control of a coating method, such as for aluminide diffusion coating, is achieved when a source powder is provided in a layer, such as a tape, preferably by combining the powder with a binder which decomposes substantially without residue upon heating.

9 Claims, No Drawings

DIFFUSION COATING METHOD

This is a division of application Ser. No. 447,318, filed Mar. 1, 1974.

The invention herein described was made in the course of or under a contract, or a subcontract thereunder, with the United States Department of the Air Force.

BACKGROUND OF THE INVENTION

This invention relates to coating of metallic articles and, more particularly, to diffusion aluminide type coating.

One of the more widely known uses of the well-known diffusion aluminide method for applying coatings is the application of an aluminide coating to the surface of turbine blading members of a gas turbine engine. As a result of this and other uses, a number of diffusion aluminiding methods and materials have been described in a wide variety of publications.

In general, the diffusion aluminide method involves cleaning the article surface to be coated and then placing such surface in contact with a halide vapor carrying the coating material in an inert or reducing atmosphere. The most commonly used method is the pack diffusion method in which the article is immersed or packed in a powdered mixture including a metallic powder which acts as the source of the coating material and a halide salt activator which reacts with the metallic powder to provide the coating metal halide vapor. One example of this method is described in U.S. Pat. No. 3,667,985, issued June 6, 1972. Another method, one example of which is described in U.S. Pat. No. 3,598,638, issued Aug. 10, 1971, involves contacting a surface to be coated only with a halide vapor of the coating metal rather than the metal itself.

In the manufacture of such coated articles, it frequently becomes necessary to repair such a coating, for example, as a result of the article having been operated in a gas turbine engine. In other instances, coating repairs are required during initial manufacture or on complete overhaul as a result of reworking procedures conducted after coating.

During initial manufacture of an article, the commonly used aluminide coating methods, which generally require a relatively high temperature, can be coordinated with joining operations such as brazing so as not to affect detrimentally the completely fabricated article. However, during repair or overhaul of such a brazed article, care must be taken that the repair coating must maintain the quality and integrity of the brazed joint.

SUMMARY OF THE INVENTION

It is a principal object of the present invention to provide improved materials and method which can be used for the complete coating or for the localized repair of an aluminide coating at a temperature below that which will affect detrimentally either a previously applied coating or materials, such as braze alloys, used to join components of the article.

Another object is to provide a powder in which aluminum is included as a source for reaction with a halide in diffusion aluminiding.

Still another object is to provide such powder in a shape of relatively uniform thickness and activity for ease of application.

These and other objects and advantages will be more clearly understood from the following detailed description and examples, all of which are intended to be typical of rather than in any way limiting on the scope of the present invention.

Briefly, the present invention in one form provides a coating alloy powder of uniform activity consisting essentially of, by weight, about 53–58% Al with the balance Fe and characterized by the elements being in the form of a two-phase structure of $Fe_2Al_5$ and $FeAl_3$.

In another form, the present invention relates to a shape, referred to herein as a tape, which results from applying a coating source powder in a relatively thin sheet or film for example from a mixture of the coating source powder and a binder preferably one which decomposes substantially without residue upon heating.

In one form of the method associated with the present invention, an article surface, or a localized surface adjacent an aluminide coating on an article, is cleaned and the powder, which can be in the form of a tape, is placed in contact with the surface in a non-oxidizing atmosphere in the presence of a halide salt activator. Then the temperature of the powder and surface is raised to the temperature range of about 1700°–2100° F to transfer and diffuse Al into the surface. Thereafter, powder residue remaining on the surface is removed.

DESCRIPTION OF THE PREFERRED EMBODIMENTS

The coating materials and method with which the present invention is associated are effective and controllable without detriment, either to the substrate or, in the case of a patch coat, to an adjacent aluminide coating. During the evaluation of the present invention, it was recognized that certain elements in other reported coating source materials either cause the processing temperature to be excessively high for repair use, resulted in insufficient oxidation resistance or affected detrimentally either the substrate, the adjacent coating or both. For example, inclusion of Si in such a repair coat resulted in extensive Si diffusion particularly into nickel-base superalloys resulting in a change of microstructure to a substantial depth after high temperature oxidation exposure.

One form of the present invention employs as an aluminum source for aluminide coating a metallic powder the aluminum activity of which is significantly higher than the aluminum activity of ordinary coating powders which do not melt at reaction temperatures. A high activity is desirable to increase the reaction driving force at a reduced temperature. It was recognized that the two compounds $Fe_2Al_5$ and $FeAl_3$ had the desired high aluminum activity, allowing a relatively low potential application temperature. Also, their elements would not detrimentally affect the substrate or the adjacent coating during repair application. Reference to the binary phase diagram for Al-Fe discloses a two-phase structure of $FeAl_5$ and $FeAl_3$ existing between about 53–58 weight percent Al with the balance Fe, sandwiched between two single-phase regions of $Fe_2Al_5$ and $FeAl_3$. This entire region defined by the single and two-phase structures includes the composition range of about 51-61 weight percent Al with the balance Fe. There are process control advantages in operating in this region, particularly in the two-phase structure because the Al activity is uniform and high irrespective of composition in the two-phase region. At the same time, the alloy has a relatively high liquidus, in excess of 2100° F. This allows coating to be conducted at a temperature such as about 1800°–1850° F without risk of at least partially melting the alloy powder which acts as a source of Al. Melting causes pitting surface defects and an undesirable coating structure.

By way of comparison, in order to obtain equivalent activity with such binaries as TiAl or NiAl, there is required a higher weight percent of Al. However, such increased amount of Al lowers the melting temperature of the alloy. For example, in the NiAl system, about 60 wt. % Al has an activity equivalent to that of $Fe_2Al_5$, $FeAl_3$. In such cases, at a desired coating temperature of 1800° F the powdered NiAl alloy is partially liquid.

As was mentioned before, the preferred range of the alloy associated with the present invention is about 53–58% Al with the balance Fe. Across the two-phase region which this composition defines in the Al-Fe binary relationship, the thermodynamic activity of both constituents remain constant. Therefore, in this range the coating process characteristics remain constant. The single-phase regions for $Fe_2Al_5$ and $FeAl_3$, respectively sandwiching the two-phase region, are useful as coating compositions although the Al activity and coating characteristics change with composition. However, because of the relative narrowness of each single-phase compound, the variation in characteristics can be tolerated for some applications.

The 51–61 wt. % Al, balance Fe powdered alloy range associated with the present invention can be used in a number of ways to coat the surface of an article. In the localized repair of previously aluminided article surfaces such as those based on nickel or cobalt superalloys, it is first desirable to clean from the surface to be treated undesirable surface contamination. This can include products of oxidation or corrosion or both, oil, products of combustion, etc. Thereafter, the powdered alloy can be placed in contact with the cleaned surface in the non-oxidizing atmosphere in the presence of a halide salt activator which will react with the powdered alloy to provide a halide of the coating metal, such as an aluminum halide. Then the well-known diffusion aluminiding process is conducted. For example, one such process is described in the aforementioned U.S. Pat. No. 3,667,985. That patent describes the most practical halide salt activators as those selected from NaF, KF, $NH_4Cl$ and $NH_4F$. In another method, described in the aforementioned U.S. Pat. No. 3,598,638, coating metal halide vapor contacts the surface to be coated.

The composition and thickness of an aluminide coating are functions of both the activity and mass of Al capable of being transferred from the Al source to the surface to be coated in the processing time. One form of the present invention maintains the activity of the Al source at a uniform level through the use of the 53–58% Al, balance Fe powder described above. Control of the coating thickness depends on the kinetics of diffusion reactions at the article surface (where kinetics depend on temperature and activities) and also on the mass of Al available for transfer from the source powder to the article surface. The amount of source material can be determined by mass balance calculations and experimental trials. Once the desired amount is determined, the uniform application of this amount, as with a tape, becomes the method of control.

One particularly advantageous form of the method associated with the present invention is the provision of an Al source powder, such as from Al or an alloy including Al, for example the iron-aluminum powder, in the form of a tape which comprises the powder and preferably a binder. Such a tape, which in this specification is intended to include variously shaped and sized sheets, films, etc., was produced by first mixing the powder with a binder. The binder in this example was of a type which decomposes substantially without residue upon heating at the coating temperature, for example at 1800° F. One such binder in common use in the art is a solution of acrylic resin commercially available in several forms particularly for the brazing art. The powder, which is preferably in the size range of about −100/+325 mesh size was mixed with sufficient binder to form a paste. Then the paste was applied to a surface in a uniform thickness in order to form the tape, sheet, film, etc. It is convenient to apply such a paste or slurry to a flexible plastic film, such as of polyethylene material, carried on a rigid plate so that the film protects the tape from fragmentation. The preferred thickness of the metal powder in such a tape is about 0.01–0.05 inch, although it will be understood by those skilled in the art that such thickness can be varied depending upon the amount of aluminum which is desired to be transferred from the coating powder source into the article surface being treated. Because the thickness and composition of the coating formed through the present invention is dependent, for a given coating powder, upon the amount of coating powder applied to the surface, provision of the coating powder in a film or sheet of uniform thickness affords close control of the coating applied and economy as well. After the paste was applied to a flexible backing strip by spreading the mixture to the desired thickness, the binder was partially volatilized leaving a pliable tape with constant density and thickness.

If close control is not required in a particular application, the powder can be applied to the surface to be treated in a variety of other ways most convenient to the application. For example, the powder can be mixed with the binder to form a slurry or paste which is applied directly to the surface to be treated.

The aluminiding method then proceeds in a usual manner by placing the article thus processed in a non-oxidizing atmosphere in the presence of a halide salt activator and increasing the temperature for example to about 1800-1850° F for that period of time desired to diffuse aluminum into the surface to be coated. Fe does not transfer from the iron-aluminum alloy into the coated surface.

As another example, the powder can be mixed with an inert material, such as $Al_2O_3$, and a halide salt activator to form a pack into which the surface to be coated is inserted. The aluminiding then proceeds in a non-oxidizing atmosphere, for example at 1800°–1850° F for the desired time.

During evaluation of the present invention, a variety of iron-aluminum powders within the scope of the present invention were procured and tested. The following table lists the analysis of certain of such powders:

TABLE

| Example | POWDER COMPOSITION COMPOSITION (Wt. %) | | | Phases |
|---------|------|------|-------|------|
|         | Fe   | Al   | Other |      |
| 1       | 46.3 | 53.7 | .03   | $Fe_2Al_5$,$FeAl_3$ |
| 2       | 45.7 | 53.4 | .89   | $Fe_2Al_5$ |
| 3       | 40.7 | 58.9 | .48   | $FeAl_3$ |

The size of the powders shown in the above table ranged from −100 mesh to −325 mesh. X-ray analysis of the powders showed them to be a mixture of $Fe_2Al_5$ and $FeAl_3$ due to the fact that the actual composition of the powders did not exactly equal that necessary to produce only one stoichiometric compound. Since the aluminum activity is constant across the two-phase region, the fact that the powders are a mixture of the two phases indicates that they will have the same driving force for coating formation.

Patch coating properties of the present invention were investigated in connection with a variety of nickel-base and cobalt-base superalloys of which typical examples are Rene 80 alloy and X-40 alloy. The nominal compositions, by weight, of these alloys are 0.17% C, 14% Cr, 5% Ti, 0.015% B, 3% Al, 4% W, 4% Mo, 9.5% Co, 0.06% Zr with the balance essentially Ni and incidental impurities for a Rene 80 alloy, and 0.5% C, 25.5% Cr, 7.5% W, 10.5% Ni, with the balance Co and incidental impurities for X-40 alloy.

Specimens of the above-identified and other alloys were coated with an aluminide coating and a local area was stripped to remove a portion of the coating. The above-identified powders were mixed with an acrylic binder to form a paste which then was applied in an even layer to a flexible plastic back-up sheet. A portion of the binder was volatilized to produce a tape or sheet of powder in a thickness range of about 0.01–0.03 inch. A portion of the tape was cut to an appropriate size and bonded to the stripped area with an acrylic resin cement. The cement had the same characteristic as did the binder used in forming the original paste, of decomposing substantially without residue upon heating. The specimens were then placed in a coating box in the presence of an $NH_4F$ activator. Then the box and its contents were heated to about 1800° F and held for four hours under a non-oxidizing atmosphere, for example hydrogen or argon covering gas. The specimens were then removed and the remaining powder was cleaned away by brushing from the area which had been patch coated. A characteristic of the tape associated with the present invention is that it does not itself become part of the coating because the Fe in the iron-aluminum alloy does not transfer to the coating. Such alloy merely acts as a non-melting, aluminum source for diffusion into the substrate. Thus, after diffusion coating, the balance of the powder from tape remaining is removed.

Photomicrographic studies of the apparent juncture between the patched aluminide coating and the original aluminide coating showed virtually no discontinuity and made identification of such interface very difficult. In a variety of tests which included oxidation, hot corrosion and thermal fatigue, it was found that the patch coat performed substantially the same as did the original aluminide coating.

Thus, the present invention provides an aluminide coating that can be formed in the temperature range of about 1700°–2100° F from an iron-aluminide powder having a chemical composition between two stoichiometric compounds $Fe_2Al_5$ and $FeAl_3$ as the aluminum source. The aluminum is transferred to a cleaned local surface as a patching coat by gaseous compounds formed from such powder and a halide activator. The aluminum activity of such powders is high and in a controllable range, since the chemical composition range of 53–58 wt. % Al with the balance Fe has substantially the same chemical activity across the range.

Although the present invention has been described in connection with specific examples, it will be understood by those skilled in the art the variations and modifications of which the present invention is capable.

What is claimed is:
1. In a diffusion coating method in which a coating metal is transferred and diffused from a coating metal source alloy into an article surface at a coating temperature in the range of 1700°–2100° F, the improvement which comprises:
   providing a mixture comprising a coating powder and a binder of a type which will decompose substantially without residue upon heating below the coating temperature, the coating powder including the coating metal source alloy which consists essentially of, by weight, about 51 − 61% Al, with the balance Fe, the alloy being predominantly in the form of a two-phase structure of $Fe_2Al_5$ and $FeAl_3$ which melts above the coating temperature;
   disposing the mixture in a layer of substantially uniform thickness to provide a substantially flexible film;
   placing the film in contact with the article surface; and then
   applying heat in the range of about 1700 − 2100° F to transfer and diffuse the coating metal from the film into the surface.

2. The method of claim 1 in which the film is placed in contact with the article surface and with a surface of a coating adjacent the article surface.

3. In the method of claim 1 in which:
   the mixture includes a halide salt activator; and
   the application of heat is conducted in a non-oxidizing atmosphere for a time sufficient to react the coating metal with the halide salt activator to provide an aluminum halide and to transfer and diffuse aluminum from the aluminum halide into the surface.

4. The method of claim 3 in which:
   the article surface is based on an element selected from the group consisting of Ni and Co; and
   the halide salt activator is selected from the group consisting of NaF, KF, $NH_4Cl$, $NH_4F$ and their mixtures.

5. The method of claim 4 in which the heating is in the range of about 1800°–1850° F.

6. The method of claim 4 in which the alloy consists essentially of, by weight, 53–58% Al with the balance Fe.

7. In a method of applying a localized patch aluminide diffusion coating to a portion of an article surface having an aluminide diffusion coating adjacent the portion, the steps of:
   cleaning the portion;
   providing a mixture comprising a coating powder and a binder of a type which will decompose substantially without residue upon heating below a coating temperature in the range of about 1700°–2100° F, the coating powder including a coating metal source alloy consisting essentially of, by weight, about 51–61% Al, with the balance Fe, the alloy being predominantly in the form of a two-phase structure of $Fe_2Al_5$ and $FeAl_3$ which melts above the coating temperature;
   disposing the mixture in a layer of substantially uniform thickness to provide a substantially flexible film;
   placing the film in contact with the portion;

subjecting the portion and the adjacent aluminide coating to a non-oxidizing atmosphere in the presence of a halide salt activator which will react with the alloy powder to provide an aluminum halide; and then applying heat in the range of about 1700° – 2100° F for a time sufficient to react the alloy powder with the halide salt activator to provide the aluminum halide and to transfer and diffuse aluminum from the aluminum halide into the article surface and into the aluminide coating adjacent the article surface.

8. The method of claim 7 in which the article surface is based on an element selected from the group consisting of Ni and Co.

9. The method of claim 8 in which the alloy powder consists essentially of, by weight, 53–58% Al with the balance Fe.

* * * * *